(12) United States Patent
Kaul et al.

(10) Patent No.: US 6,617,991 B2
(45) Date of Patent: Sep. 9, 2003

(54) STRUCTURE FOR ADJUSTING GAIN IN A FLASH ANALOG TO DIGITAL CONVERTER

(75) Inventors: Richard T. Kaul, Essex Junction, VT (US); Steven J. Tanghe, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/832,775

(22) Filed: Apr. 11, 2001

(65) Prior Publication Data

US 2002/0149507 A1 Oct. 17, 2002

(51) Int. Cl.[7] ................................................. H03M 1/12
(52) U.S. Cl. ....................... 341/155; 341/118; 341/120; 341/143; 341/144; 341/154; 341/156
(58) Field of Search ................................... 341/118, 120, 341/122, 126, 155, 156, 154, 200, 139, 143, 144, 166; 340/146.3

(56) References Cited

U.S. PATENT DOCUMENTS

| | | | |
|---|---|---|---|
| 3,872,434 A | * 3/1975 | Duvall et al. ............... | 382/270 |
| 5,343,201 A | * 8/1994 | Takayama et al. .......... | 341/200 |
| 5,563,598 A | * 10/1996 | Hickling ..................... | 341/155 |
| 5,635,934 A | * 6/1997 | Brown ........................ | 341/118 |
| 5,774,086 A | * 6/1998 | Guyot ......................... | 341/159 |
| 5,990,750 A | * 11/1999 | Karz ........................... | 330/295 |
| 5,990,817 A | * 11/1999 | Belin et al. ................. | 341/139 |
| 6,292,120 B1 | * 9/2001 | Painchaud et al. .......... | 341/139 |

* cited by examiner

Primary Examiner—Michael Tokar
Assistant Examiner—Linh Van Nguyen
(74) Attorney, Agent, or Firm—McGinn & Gibb, PLLC; Richard A. Henkler, Esq.

(57) ABSTRACT

A flash analog to digital converter includes a reference ladder, consisting primarily of resistors, a plurality of comparators, each coupled to a different reference voltage on the reference ladder (the comparators compare a received voltage with a reference voltage level developed across corresponding resistor or group of resistors), and a variable power source coupled to the reference ladder for varying the reference levels generated from the ladder. The structure includes a fixed (or variable) gain driver supplying the received signal voltage to the bank of comparators. The variable power source can be an adjustable current source or an adjustable voltage source. The comparators can be single-ended comparators or differential comparators.

8 Claims, 2 Drawing Sheets

STRUCTURE FOR ADJUSTING GAIN IN A FLASH ANALOG TO DIGITAL CONVERTER

BACKGROUND OF THE INVENTION

1. Field of the Invention

The present invention generally relates to analog to digital signal converters and more particularly to flash analog to digital converters that utilize very low voltages.

2. Description of the Related Art

As integrated circuit technology advances, digital circuits are proliferating. Yet, many digital circuits receive inputs that are analog in nature. Analog to digital converters (ADCs) are used to convert the analog input signals to digital form. A family of ADCs known as "flash ADCs" are almost exclusively used where conversion speed is the highest concern. As power supply voltages decrease with newer technologies, the design of flash ADCs becomes more challenging. One way to ease the ADC design is to use digital calibration to correct for non-idealities in the analog portion of the circuit.

More specifically, effective gain adjustment or calibration through the ADC can be achieved by modifying the gain of the driver stage of the ADC. However, this can be quite difficult in some amplifiers where the gain is controlled via feedback resistors. In this case, the closed loop gain is controlled by the ratio of resistors. Adjusting the resistor ratio to control the gain has unpleasant effects. In the simplest form, such a solution must add transistors in the resistor path to act as switches. However, such structures add unwanted capacitance to the circuit resulting in a speed reduction and can cause instability.

Therefore, there is a need for a structure which controls the digital calibration of ADC's without altering the gain of the driver or the makeup of the resistor strings. The invention described below achieves this benefit using a cost-effective straightforward structure that is easily implemented.

SUMMARY OF THE INVENTION

It is an object of the present invention to provide a flash analog to digital converter that includes a reference ladder, consisting primarily of resistors, a plurality of comparators, each coupled to a different reference voltage on the reference ladder (the comparators compare a received voltage with a reference voltage level developed across a corresponding resistor or group of resistors), and a variable power source coupled to the reference ladder for varying the reference levels generated from the ladder. The structure includes a fixed gain driver supplying the received signal voltage to the bank of comparators. The variable power source can be an adjustable current source or an adjustable voltage source. The comparators can be single-ended comparators or differential comparators.

The invention greatly simplifies the design of the driver used in the ADC by eliminating the requirement that the gain be adjustable. If gain is adjusted in the driver, the circuitry is much more complex, which results in slower circuit performance. To the contrary, instead of using an adjustable gain driver, the invention uses a simpler fixed gain driver and an adjustable source to drive the resistor ladder, thus providing adjustable reference levels.

BRIEF DESCRIPTION OF THE DRAWINGS

The foregoing and other objects, aspects and advantages will be better understood from the following detailed description of preferred embodiments of the invention with reference to the drawings, in which.

DETAILED DESCRIPTION OF PREFERRED EMBODIMENTS OF THE INVENTION

Figure 1:
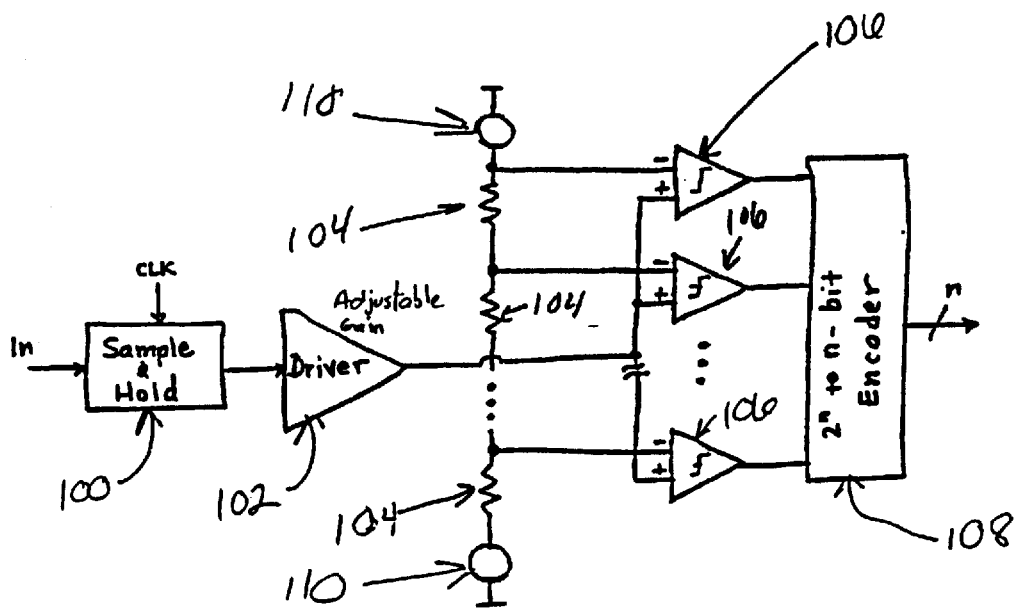
FIG. 1 is a schematic diagram of a single-ended analog to digital converter with adjustable gain driver.

This invention provides a simple and useful structure for controlling the gain in a flash ADC using digital calibration. The flash ADC illustrated in FIG. 1 includes a sample and hold circuit 100 that captures the analog input signal with an update rate equal to the incoming clock signal. This captured signal is then buffered and amplified by an adjustable gain driver circuit 102. This amplified signal is fed into a bank of comparators 106 that compare the amplified signal to reference voltages generated by a biased resistor string 104. The resistor string is referred to as a "reference ladder" and can include resistors, transistors, etc. The resistor string 104 acts as a voltage divider, simply dividing the voltage at the ends of the string 110 into several smaller voltages, serving as the references to the comparators 106 in the comparator bank. The resistor string can be biased with a current or a voltage.

In this configuration, each comparator 106 has a slightly difference reference voltage. Therefore, each comparator will trip at a slightly difference input voltage. The comparator outputs are received by a logic circuit 108 that converts the signals to an encoded n-bit word. In a full-flash n-bit ADC design, $2^n-1$ comparators are needed to derive an n-bit encoded signal.

Figure 2:
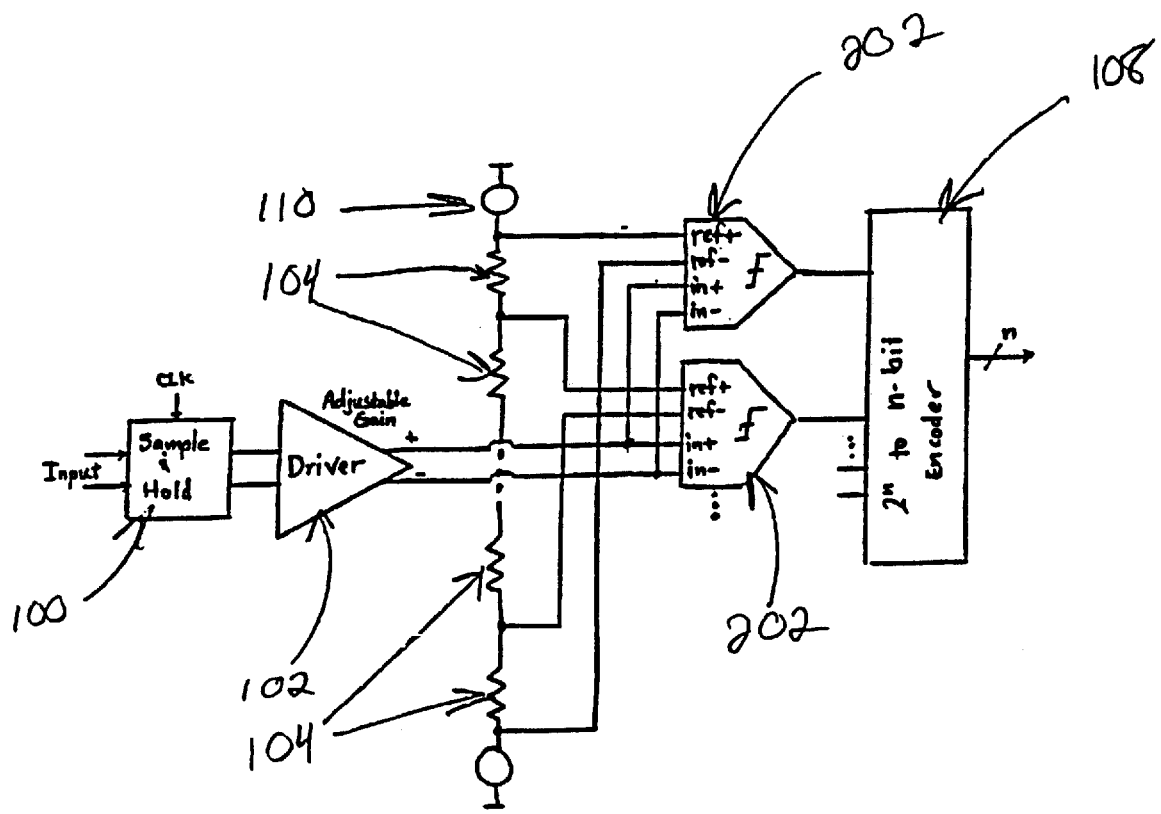
FIG. 2 is a schematic diagram of a differential analog to digital converter with adjustable gain driver.

FIG. 1 shows the single-ended converter. FIG. 2 shows more useful differential converter with differential sample and hold 100, differential driver 102, and differential comparators 202. In principle, the single-ended converter and differential converter operate in the same way, except the input signal and reference voltages are differential, which increases power supply rejection, common mode rejection, and noise immunity.

An ADC has a gain associated with it. The full scale analog input voltage is defined as the input voltage that produces all 1's at the output, or full scale digital output. Most ADCs are linear and thus a negative full scale input voltage produces all zeroes at the output. This relationship is determined by the gain through the ADC. The overall gain is determined by the analog gain associated with the driver and sample and hold circuit as well as the reference voltages produced by the ladder.

For example, suppose the full scale input voltage is 100 mV and the gain of the sample and hold is 1 and the driver gain is 4. Then the full scale voltage presented to the comparator array is 400 mV. But this will only produce a full scale digital output if the reference voltage to the topmost comparator is also 400 mV or less. If the reference voltage at the top comparator were 800 mV, then only a fraction of the comparators would trip and the signal would not be full scale in the digital realm. Therefore, the effective gain through the ADC is not only controlled by the front-end analog circuits (driver 102, sample and hold 100) but equally by the reference voltages produced by the reference ladder.

Gain adjustment (e.g., calibration) in the circuits shown in FIGS. 1 and 2 is controlled by the adjustable gain of the driver 102. However, such an adjustable gain driver is quite difficult to design and manufacture in amplifiers where the gain is controlled via feedback resistors because the closed loop gain is controlled by the ratio of resistors. Adjusting the resistor ratio to control the gain has unpleasant effects and entails adding transistors in the resistor path to act as switches. The transistors add unwanted capacitance to the circuit resulting in a speed reduction and can cause instability.

Figure 3:
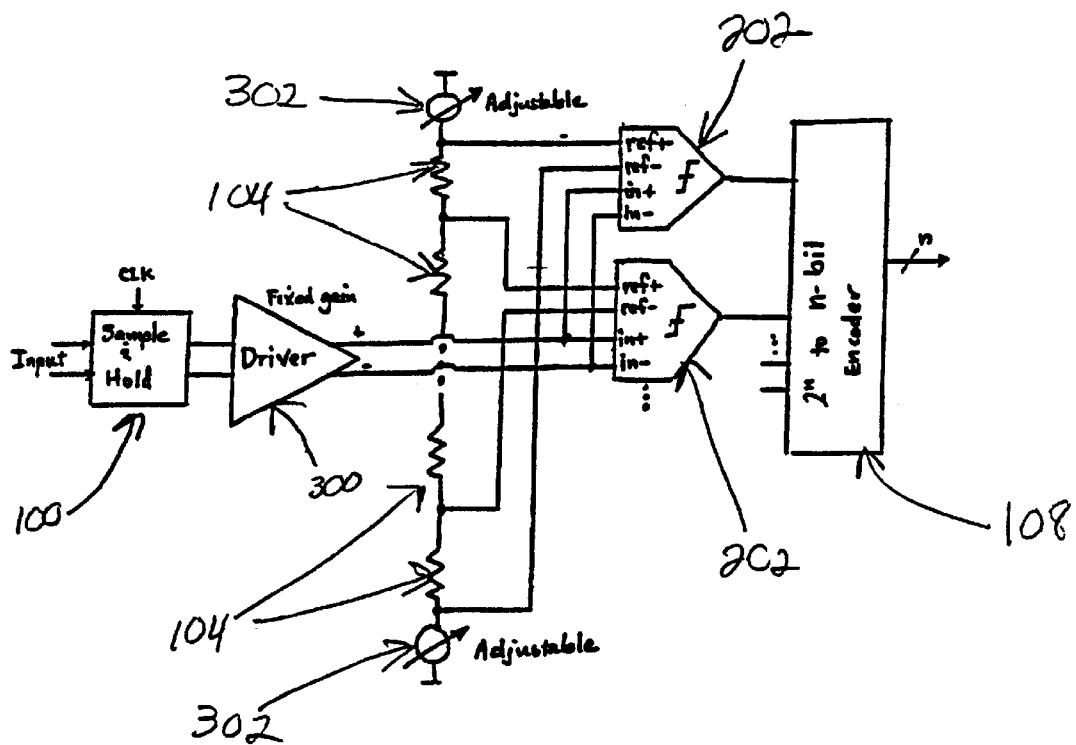
FIG. 3 is a schematic diagram of another type of analog to digital converter (differential, fixed gain driver, adjustable reference)
Figure 4:
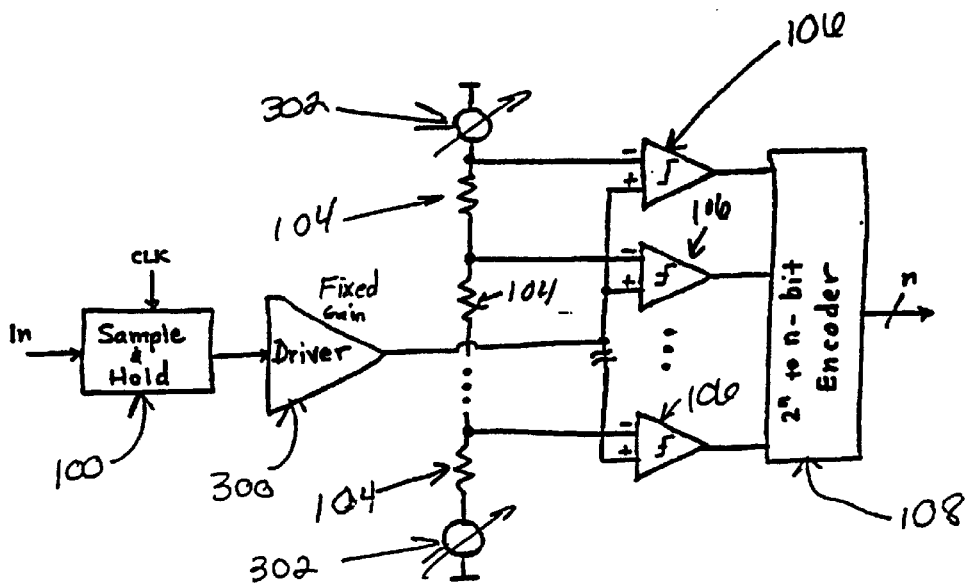
FIG. 4 is a schematic diagram of another type of analog to digital converter (single-ended, fixed gain driver, adjustable reference).

The circuit shown in FIG. 3, takes a different approach to adjusting the gain. Instead of using an adjustable gain driver, a simpler fixed gain driver 300 is used and the source 302 that drives the resistor ladder 104 is made adjustable. As would be known by one ordinarily skilled in the art given this disclosure, the invention could use a variable gain driver in combination with the adjustable resistor ladder. However, the following discussion is limited to fixed gain drivers to more clearly illustrate the benefits of the invention. In one embodiment, adjustable current sources 302 are used at the top and bottom of the resistor string 104. In a preferred embodiment, the adjustable current sources 302 are digitally controlled and are in the form of adjustable current sources, because such circuits are easily implemented and widely used. Alternately, the references 302 could be adjustable voltage sources 302. Note that, for ease of illustration both the adjustable current sources and the adjustable voltage sources are shown as items 302. FIG. 4 shows a similar adjustable current/voltage structure 302 embodiment for the single-ended comparators 106, initially discussed above with respect to FIG. 1.

Since the resistor string 104 acts as a simple voltage divider, the intermediate voltage references will scale with the end voltages and linearity will be preserved.

This invention provides a circuit that adjusts the gain in a flash analog-to-digital converter using adjustable current sources 302 at the end of the resistor string 104. In a second embodiment, the gain is adjusted by adjustable voltage references 302 at the end of the resistor string. This structure is useful in both single-ended and differential ADCs. Not only does the invention apply to a full flash design, but also to any analog to digital converter that uses a reference string to generate the multiple reference voltages used by the multiple comparators.

As mentioned above, the invention greatly simplifies the design of the driver used in the ADC by eliminating the requirement that the gain be adjustable. If gain is adjusted in the driver, the circuitry is much more complex, and can result in poorer circuit performance. To the contrary, instead of using an adjustable gain driver, the invention preferably uses a simpler fixed gain driver 300 and an adjustable power source 302 to drive the resistor ladder 104.

While the invention has been described in terms of preferred embodiments, those skilled in the art will recognize that the invention can be practiced with modification within the spirit and scope of the appended claims.

What is claimed is:

1. A flash analog to digital converter comprising:
    a reference ladder with resistive elements;
    a plurality of comparators, each coupled to different reference voltages generated by said reference ladder, said comparators comparing a received voltage with said reference voltages from said reference ladder; and
    an adjustable current source coupled to said reference ladder for varying current flowing through said reference ladder,
    wherein said adjustable current source comprises a first adjustable current source at a first end of said reference ladder and a second adjustable current source at a second end of said reference ladder.

2. The flash analog to digital converter in claim 1, further comprising one of a variable gain driver and a fixed gain driver supplying said received voltage to said comparators.

3. The flash analog to digital converter in claim 1, wherein said comparators comprises single-ended comparators in a single-ended signal path.

4. The flash analog to digital converter in claim 1, wherein said comparators comprises differential comparators in a differential signal path.

5. A flash analog to digital converter comprising:
    a reference ladder with resistive elements;
    a plurality of single-ended comparators, each coupled to different reference voltages generated by said reference ladder, said single-ended comparators comparing a received voltage with said reference voltages from said reference ladder; and
    a variable power source coupled to said reference ladder for varying current flowing through said reference ladder,
    wherein said variable power source comprises an adjustable current source,
    wherein said adjustable current source comprises a first adjustable current source at a first end of said reference ladder and a second adjustable current source at a second end of said reference ladder.

6. The flash analog to digital converter in claim 5, further comprising one of a variable gain driver and a fixed gain driver supplying said received voltage to said comparators.

7. A flash analog to digital converter comprising:
    a reference ladder with resistive elements;
    a plurality of differential comparators, each coupled to different reference voltages generated by said reference ladder, said differential comparators comparing a received voltage with said reference voltages from said reference ladder and;
    a variable power source coupled to said reference ladder for varying current flowing through said reference ladder,
    wherein said variable power source comprises an adjustable current source,
    wherein said adjustable current source comprises a first adjustable current source at a first end of said reference ladder and a second adjustable current source at a second end of said reference ladder.

8. The flash analog to digital converter in claim 7, further comprising one of a variable gain driver and a fixed gain driver supplying said received voltage to said comparators.

* * * * *